United States Patent [19]

Shekhawat

[11] Patent Number: 5,130,917
[45] Date of Patent: Jul. 14, 1992

[54] POWER INVERTER SNUBBER CIRCUIT

[75] Inventor: Sampat S. Shekhawat, Middletown, N.J.

[73] Assignee: Allied-Signal Inc., Morris Township, Morris County, ; 4 07141992 ZZX None 11 1 1 Sterrett; Jeffrey Stephan; Steven L. 5 6 1

[21] Appl. No.: 706,452

[22] Filed: May 28, 1991

Related U.S. Application Data

[63] Continuation-in-part of Ser. No. 455,040, Dec. 22, 1989, abandoned.

[51] Int. Cl.$^5$ ............................................. H02H 7/122
[52] U.S. Cl. ........................................ 363/56; 363/37; 363/131; 363/134
[58] Field of Search ...................... 363/36, 37, 55, 56, 363/97, 98, 131, 132, 133, 134

[56] References Cited

U.S. PATENT DOCUMENTS

| | | | |
|---|---|---|---|
| 4,443,841 | 4/1984 | Mikami et al. | 363/132 |
| 4,519,022 | 5/1985 | Glennon | 363/132 |
| 4,542,451 | 9/1985 | Hucker | 363/98 |
| 4,635,177 | 1/1987 | Shekhawat et al. | 363/98 |
| 4,651,267 | 3/1987 | Nguyen et al. | 363/56 |
| 4,670,828 | 6/1987 | Shekhawat et al. | 363/56 |
| 4,862,342 | 8/1989 | Dhyanchand et al. | 363/132 |
| 4,961,129 | 10/1990 | Shekhawat | 363/132 |

Primary Examiner—Steven L. Stephan
Assistant Examiner—Jeffrey Sterrett
Attorney, Agent, or Firm—Howard G. Massung; Robert A. Walsh

[57] ABSTRACT

A snubber circuit for a neutral clamped power inverter. The power inverter includes power transistors, a current sensor at the inverter output and a neutral clamping circuit connected between the inverter output and a neutral point in a DC power source which supplies the inverter. A controller circuit is connected to the current sensor, to the power transistors and to the neutral clamping circuit to selectively enable and disable the power transistors and the neutral clamping circuit in accordance with the inverter operation and current direction at the inverter output to minimize current transients at a load. An active snubber arrangement is provided to minimize snubber losses when the power transistors are inactive during alternate positive and negative half-cycles of operation.

11 Claims, 5 Drawing Sheets

POWER INVERTER SNUBBER CIRCUIT

CROSS REFERENCE TO RELATED APPLICATIONS

This application is a Continuation-In-Part of commonly assigned co-pending U.S. application Ser. No. 455,040 filed by the present inventor on Dec. 22, 1989 now abandoned.

BACKGROUND OF THE INVENTION

This invention relates to power switching circuits. More specifically, the invention relates to a snubber circuit in a power switching circuit which enables improved operating efficiencies.

Conventional power inverters provide a pair of power transistor switches connected in series between positive and negative DC terminals which operate during opposite half cycles to provide an AC output. The wire leads between components, however, create parasitic inductances which increase voltage spikes across the power transistor switches. As a result, snubber circuits are used to reduce the affect of these parasitic inductances and to also reduce switching losses in the power transistor switches.

An example of a conventional snubber circuit is a circuit having a parallel connection of a resistor and a diode connected in series with a capacitor, and which circuit is connected across the collector and emitter of each power transistor connected in series between the positive and negative terminals. The capacitor is charged by a circuit spike resulting from the parasitic inductances. The capacitor discharges through the resistor when the power transistor is turned on. The conventional snubber circuit results in high power losses since the snubber circuit remains active throughout the output frequency cycle period. This results in high snubber circuit losses.

A snubber circuit for a power inverter which provides high efficiency inverter operation is therefore needed.

SUMMARY OF THE INVENTION

This invention contemplates a power inverter snubber circuit for canceling the effects of parasitic inductances in the inverter. The inverter preferably includes a DC power source, a first power transistor connected between a positive terminal in the DC power source and an inverter output terminal, and which first transistor is selectively enabled and disabled to provide a positive AC voltage at the output terminal during a positive cycle of operation, and a second power transistor connected between a negative terminal in the DC power source and the output terminal, and which second transistor is selectively enabled and disabled to provide a negative AC voltage at the output terminal during a negative cycle of inverter operation. The inverter further preferably includes a neutral clamping circuit which selectively provides a current path between a neutral terminal in the DC power source and the output terminal and clamps the output terminal potential to the neutral terminal potential. A snubbing capacitor is provided between the first power transistor collector and the neutral clamping circuit as well as between the second power transistor emitter and the neutral clamping circuit. Circuitry is provided so that snubbing losses which would otherwise occur are eliminated when the snubber circuit is inactive.

It is an object of the present invention to provide a power switching circuit including power transistors, wherein the effects of parasitic inductances are minimized and turn-off losses of the power transistors are reduced.

It is a further object of the present invention to provide a power switching circuit wherein variations in output current are reduced.

It is another object of the present invention to provide a power switching circuit wherein the voltage rise time across the power transistors is reduced.

It is yet another object of the present invention to provide a power switching circuit of the type described having improved operating efficiency.

It is still another object of the present invention to provide a power switching circuit having a snubber circuit with a reduced component count, and wherein snubbing losses are eliminated when the power switching circuits are inactive during alternate positive and negative half-cycles of operation.

DETAILED DESCRIPTION OF THE INVENTION

Figure 1:
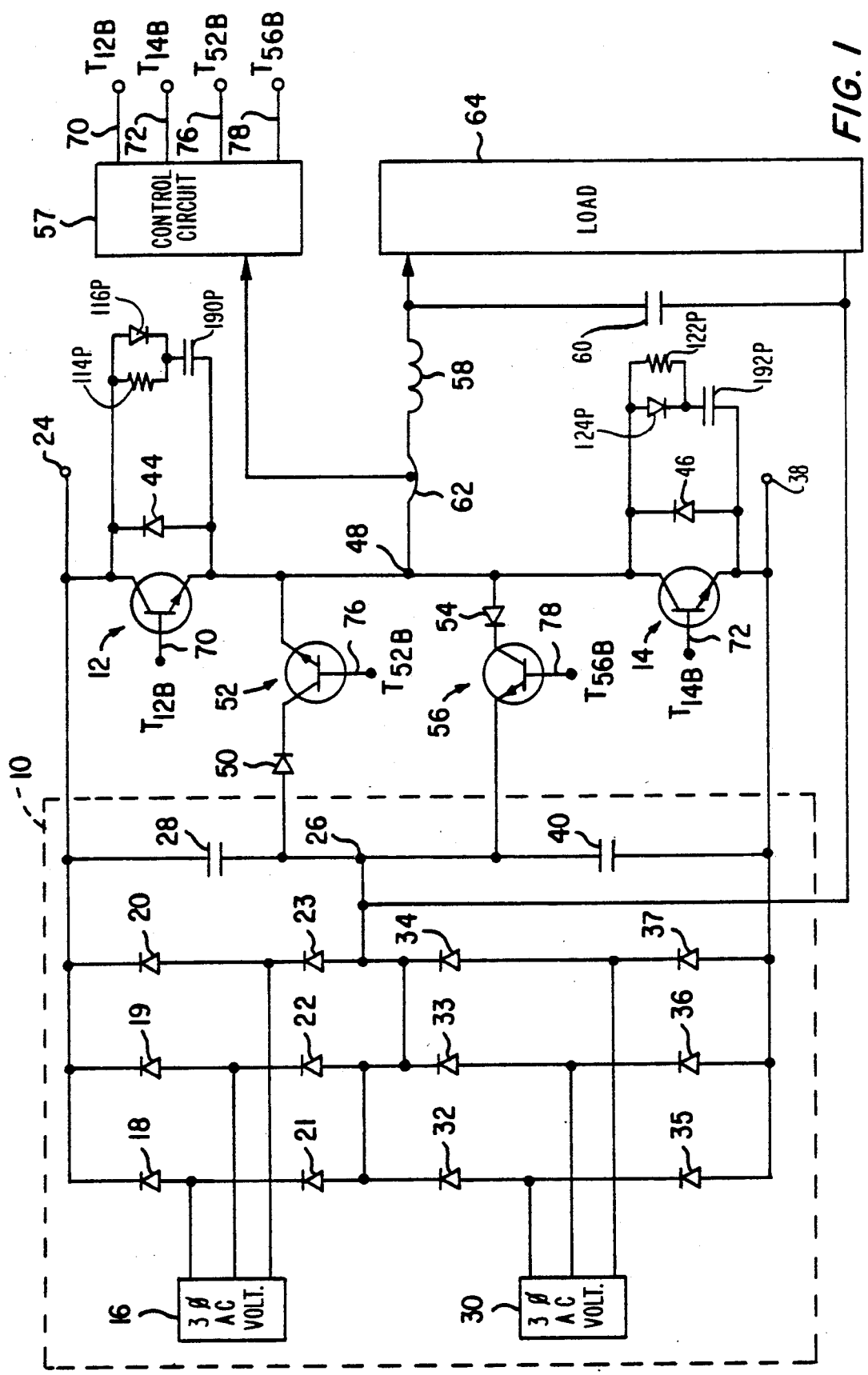
FIG. 1 is an electrical schematic diagram illustrating a neutral point clamped power inverter and conventional snubber circuitry.

FIG. 1 illustrates a neutral point clamped power inverter in accordance with a preferred embodiment of the present invention. The power inverter has a DC power supply 10 for supplying DC voltages to a power switch 12 and a power switch 14. A desired positive voltage is generated during a positive cycle of inverter operation by the selective enabling and disabling of power switch 12. Similarly, a desired negative voltage is generated during a negative cycle of inverter operation by the selective enabling and disabling of power switch 14. Switches 12 and 14 can be controlled by predetermined control signals or varied in accordance with a feedback circuit to obtain a desired AC output voltage.

DC power supply 10 preferably includes a first three-phase AC supply 16. The three-phase AC voltage provided by supply 16 is full-wave rectified by a bridge circuit comprising diodes 18 to 23. A DC voltage is thereby provided across a positive terminal 24 and a neutral terminal 26. A capacitor 28 smoothes this DC voltage.

DC power supply 10 preferably includes a second three-phase AC supply 30. The three-phase AC voltage provided by supply 30 is full wave rectified by a bridge circuit comprising diodes 32 to 37. A DC voltage is thereby provided across neutral terminal 26 and a negative terminal 38. A capacitor 40 smoothes this DC voltage.

Terminal 26 forms a neutral point in DC supply 10 between positive terminal 24 and negative terminal 38. Switches 12 and 14 are connected in series between positive terminal 24 and negative terminal 38. Switch 12 is preferably a power transistor having a collector connected to terminal 24, an emitter connected to an inverter output terminal 48 and a base which is selectively controlled such that a desired positive voltage is developed at output terminal 48 during a positive cycle of inverter operation.

Switch 14 is also preferably a transistor which has an emitter connected to negative terminal 38, a collector connected to terminal 48 and a base which is selectively controlled such that the desired negative voltage is developed at the terminal 48 during a negative cycle of inverter operation.

A diode 44 has an anode connected to inverter output terminal 48 and a cathode connected to positive terminal 24. Diode 44 provides a current path from output terminal 48 to positive terminal 24 so as to protect transistor 12 from damage if a transistor switch 52 and a transistor switch 56 do not turn on at the correct times. Similarly, a diode 46 has a cathode connected to output terminal 48 and an anode connected to negative terminal 38 so as to likewise protect transistor 14.

The power inverter described has a clamping circuit connected between the neutral terminal 26 in DC power supply 10 and inverter output terminal 48. In a preferred embodiment, the clamping circuit includes a diode 50 and a switch 52 which are connected in series between terminals 26 and 48 to provide a current path from neutral terminal 26 to output terminal 48 when switch 52 is enabled. Switch 52 is preferably a power npn transistor. Diode 50 has an anode connected to neutral terminal 26 and a cathode connected to the collector of transistor 52. Transistor 52 has an emitter connected to inverter output terminal 48.

Neutral terminal 26 and output terminal 48 are preferably further clamped by a circuit comprising a series connection of a diode 54 and switch 56 arranged to provide a current path from output terminal 48 to neutral terminal 26 when switch 56 is enabled. Switch 56 is preferably a power transistor. Diode 54 has an anode connected to terminal 48 and a cathode connected to the collector of transistor 56. Transistor 56 has an emitter connected to neutral terminal 26. Each of the transistors 52 and 56 has a base connected to a control circuit 57. Control circuit 57 selectively enables and disables the transistors 52 and 56 to minimize output harmonics.

The output of the described power inverter is filtered by an inductor 58 and a capacitor 60 and the filtered output is applied to a load 64. The direction of the current between output terminal 48 and load 64 is sensed by a current sensor 62 which is, for example, a current transformer electromagnetically connected between output terminal 48 and load 64. The output of current transformer 62 is applied to control circuit 57 to aid in the control of transistors 52 and 56.

As stated previously, transistors 52 and 56 are controlled by control circuit 57 so as to minimize the harmonic content of the inverter output. In one embodiment, transistor 52 is enabled wherever current flow in the inverter output, as sensed by the current transformer 62, is from output terminal 48 to load 64 if transistor 14 is disabled. This provides a current path from neutral terminal 26 to output terminal 48, thereby clamping the potential of output terminal 48 relative to the potential of neutral terminal 26. Transistor 56 is enabled whenever current flow in the inverter output is from load 64 to output terminal 48 if transistor 12 is disabled. This provides a current path from output terminal 48 to neutral terminal 26, thereby clamping the potential of output terminal 48 relative to the potential of neutral terminal 26. This operation reduces the harmonic content of the inverter output as aforenoted.

Figure 2:
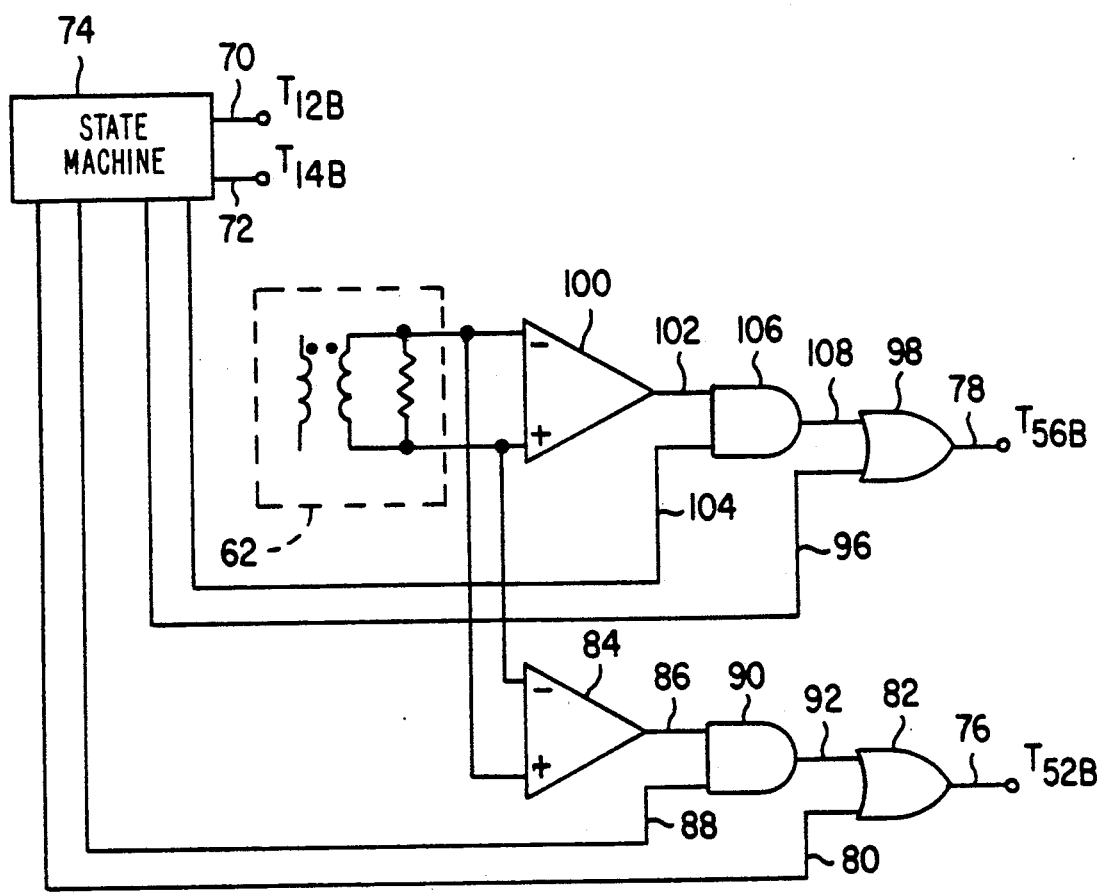
FIG. 2 is an electrical schematic diagram illustrating a preferred control circuit used in the power inverter illustrated in FIG. 1.
Figure 3:
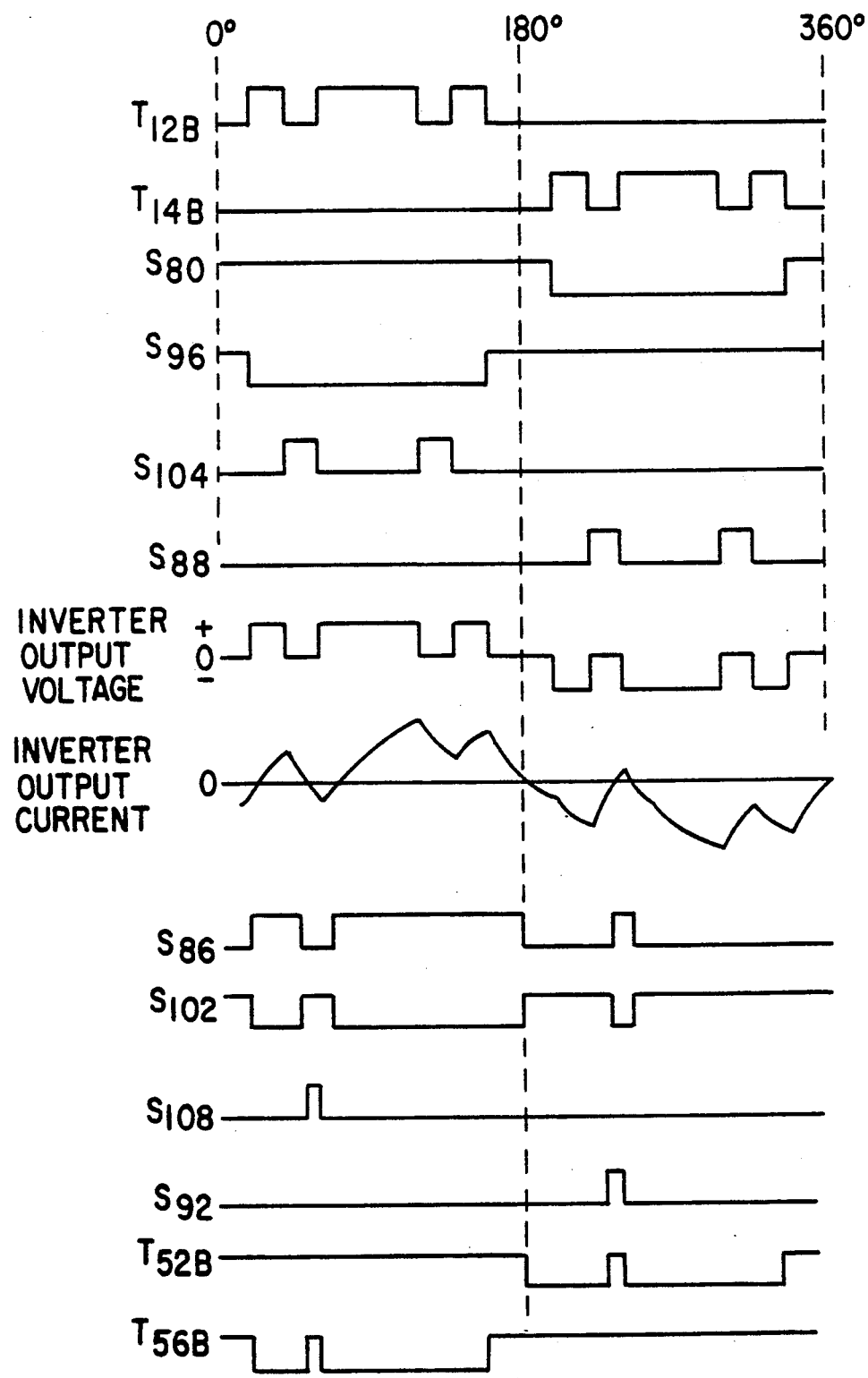
FIG. 3 illustrates control signals for the clamping circuit illustrated in FIG. 1 and the resulting operational voltages.

In a preferred embodiment of the invention, as illustrated in FIGS. 2 and 3, transistors 52 and 56 are enabled more frequently. FIG. 2 illustrates a preferred control circuit 57. FIG. 3 illustrates control signals provided by control circuit 57 and the resulting operational signals in the inverter. It is preferred to enable transistor 52 during the positive cycle of inverter operation as well as during the negative cycle of inverter operation if transistors 12 and 14 are disabled and current sensor 62 senses current flow from terminal 48 to load 64, i.e. a positive current. It is also preferred to enable transistor 56 during the negative cycle of inverter operation as well as during the positive cycle of inverter operation if transistors 12 and 14 are disabled and current sensor 62 senses current direction from load 64 to terminal 48, i.e. a negative current.

Control circuit 57 outputs a first control signal on a line 70 which is connected to the base of power transistor 12 for selectively enabling and disabling the transistor during the positive cycle of inverter operation to obtain the desired positive output voltage. Referring to FIGS. 1, 2 and 3, this control signal is indicated as $T_{12B}$. During the time that control signal $T_{12B}$ is high, transistor 12 causes the potential of output terminal 48 to be clamped relative to the potential of positive terminal 24, thereby positively biasing the output voltage, which is indicated in FIG. 3 as INVERTER OUTPUT VOLTAGE.

Controller circuit 57 further outputs a second control signal, $T_{14B}$, on a control line 72 (FIGS. 1, 2 and 3) which is connected to the base of power transistor 14 to selectively disable and enable transistor 14 during the negative cycle of inverter operation to obtain the desired negative voltage. During the times control signal $T_{14B}$ is high, transistor 14 causes the potential at output terminal 48 to be clamped relative to the potential of negative terminal 38, thereby negatively biasing the output voltage as indicated by the signal INVERTER OUTPUT VOLTAGE. Control signals $T_{12B}$ and $T_{14B}$ are preferably provided by a pre-programmed state machine 74 in controller circuit 57 as shown in FIG. 2. These control signals can also be generated on-line by means of feedback from the inverter output.

Control signals, $T_{52B}$ and $T_{56B}$, which are applied to the base of transistors 52 and 56, respectively, to minimize output harmonics are outputted from controller circuit 57 on the control lines 76 and 78, respectively (FIGS. 2 and 3). To generate the preferred control signal, $T_{52B}$, state machine 74 outputs control signals $S_{80}$ and $S_{88}$ (FIG. 3) on lines 80 and 88, respectively (FIG. 2). both of the control signals reflect the operational condition of the inverter. Control signal $S_{80}$ is high during a positive cycle of inverter operation, i.e. from approximately 0 to approximately 180 degrees of operation, as indicated in FIG. 3. Control signal $S_{80}$ is applied to an input of an OR gate 82, the output of which is control signal $T_{52B}$ for transistor 52. As a result, control signal $T_{52B}$ is high and transistor 52 is enabled during the positive cycle of inverter operation. Control signal $S_{88}$ is high during the negative cycle of operation between approximately 180 and approximately 360 degrees when transistors 12 and 14 are disabled. Control signal $S_{88}$ a first input to an AND gate 90. The second input to AND gate 90 is a signal $S_{86}$ (FIG. 3) on line 86 from a differential amplifier 84 which is driven by current transformer 62 (FIG. 2). Signal $S_{86}$ is high whenever current transformer 62 senses a current flow from terminal 48 to the load 64 (a positive current) and is low whenever current is in the opposite direction (negative). The output current is indicated as INVERTER OUTPUT CURRENT in FIG. 3. A signal, $S_{92}$ (FIG. 3) on line 92 from the output of gate 90 (FIG. 2) is, therefore, high when there is current flow from the inverter to load 64 if transistors 12 and 14 are disabled. Since signal $S_{92}$ is fed to a second input of OR gate 82, control signal $T_{52B}$ is high and transistor 52 is similarly enabled, during the negative cycle of operation if transistors 12 and 14 are disabled and the current flow is out of the inverter. The output voltage at terminal 48, therefore, remains clamped relative to the potential of neutral terminal 26 during the positive cycle of operation when transistor 12 is disabled and during the negative cycle when reactive loads cause the output current to be positive if transistors 12 and 14 are disabled, thereby reducing transients in the output and minimizing harmonics as is desireable.

To generate preferred control signal $T_{56B}$, state machine 74 outputs control signals $S_{96}$ and $S_{104}$ (FIG. 3) on lines 96 and 104, respectively. Both of these signals reflect the operational condition of the inverter. Signal $S_{96}$ is high during a negative cycle of inverter operation, i.e. from approximately 180 to approximately 360 degrees as indicated in FIG. 3. Control signal $S_{96}$ is fed to an input of an OR gate 98 (FIG. 2), the output of which is control signal $T_{56B}$ for transistor 56. As a result, signal $T_{56B}$ is high and transistor 56 is enabled during the negative cycle of inverter operation. Control signal, $S_{104}$, which is high during the positive cycle of operation between 0 and 180 degrees when transistors 12 and 14 are disabled, is connected to a first input of an AND gate 106 (FIG. 2). The second input of gate 106 is a signal $S_{102}$ (FIG. 3) on line 102 from a differential amplifier 100 which is driven by current transformer 62. Signal $S_{102}$ on line 102 is high whenever current transformer 62 senses a current flow from load 64 to terminal 48, i.e. a negative current, and is low whenever the current is in the opposite direction, i.e. positive current. Signal $S_{108}$ on line 108 from the output of gate 106 (FIG. 3) is, therefore, high when transistors 12 and 14 are disabled and when there is current flow into the inverter from load 64. Since signal $S_{108}$ is fed to a second input of OR gate 98, control signal $T_{56B}$ is high and the transistor 56 is enabled, during the positive cycle of operation when the current flow is into the inverter from load 64 if the transistors 12 and 14 are disabled. The output voltage at terminal 48, therefore, remains clamped relative to the potential of neutral terminal 26 during the negative cycle of operation when transistor 14 is disabled and during the positive cycle of operation when reactive loads cause the output current to be negative if transistors 12 and 14 are disabled, thereby reducing transients in the output and minimizing harmonics.

Note that control signals $S_{80}$ and $S_{96}$ which indicate a positive cycle of inverter operation and a negative cycle of inverter operation, respectively, preferably overlap (FIG. 3). That is, signal $S_{80}$ indicates a positive cycle of operation starting shortly before 0 degrees and ending shortly after 180 degrees. Similarly, signal $S_{96}$ indicates a negative cycle of operation extending from shortly before 180 degrees to shortly after 360 degrees.

Figure 4:
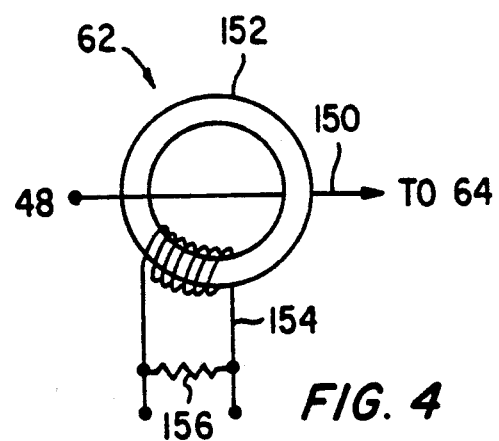
FIG. 4 is a diagrammatic representation illustrating a current transformer shown generally in FIG. 1 for sensing output current direction.

FIG. 4 illustrates a preferred current transformer 62. A conductor 150 between output terminal 48 and load 64 passes through a magnetic metal doughnut member 152. Conductor 150 forms the primary winding of transformer 62. A conductor 154 is wound about metal doughnut member 152 to form the secondary winding of transformer 62. A resistor 156 is connected across the two ends of conductor 54. When a current flows through conductor 150, an equal number of ampere turns are induced in the secondary of the current transformer. The direction of the current in wire 154 depends on the direction of the current in wire 150.

Figure 5:
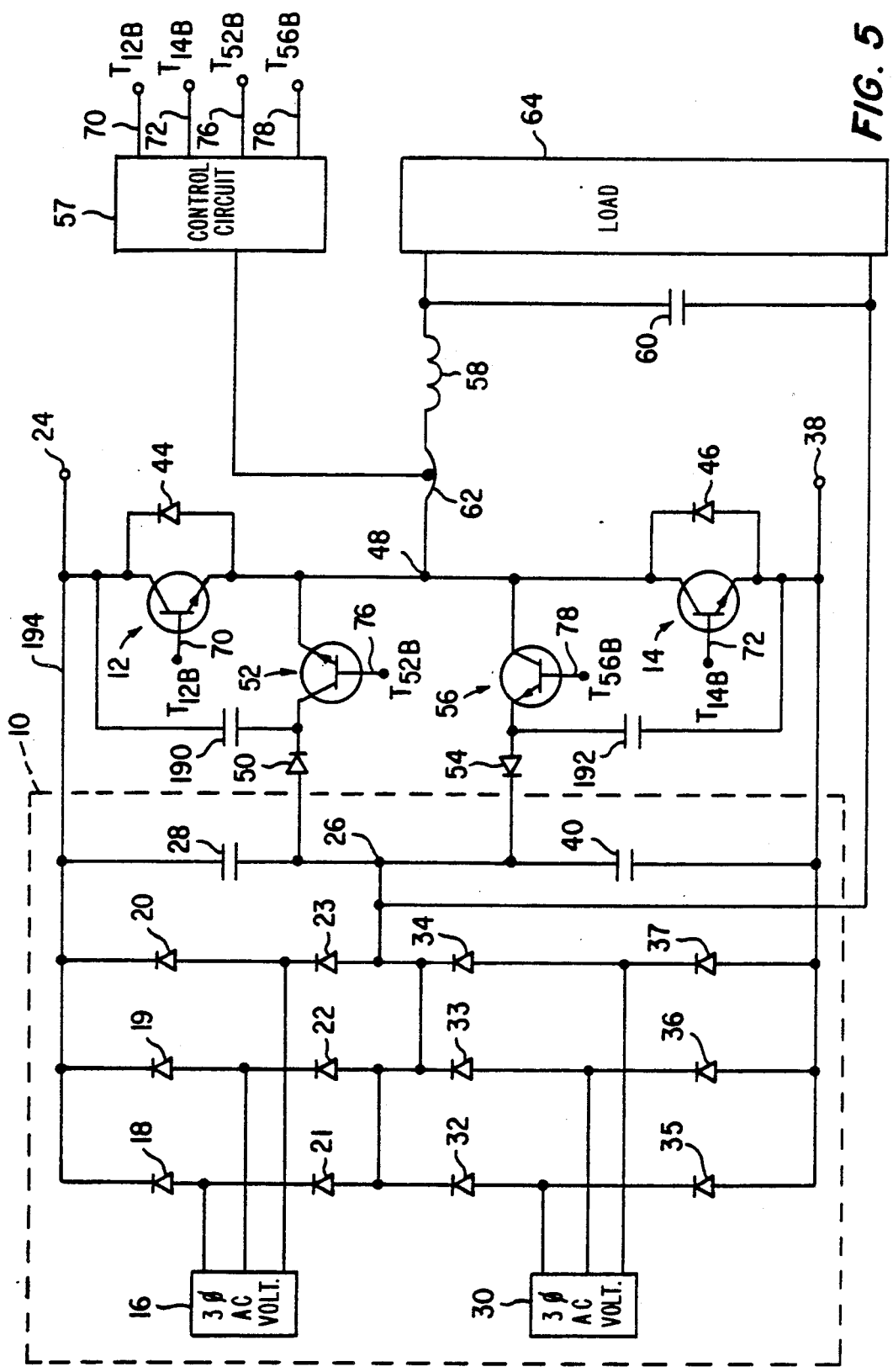
FIG. 5 is an electrical schematic diagram illustrating a neutral clamped power inverter having a snubber circuit in accordance with the present invention.

FIG. 5 illustrates a neutral clamped power inverter having snubber circuits in accordance with the present invention. A first snubber circuit includes a capacitor 190 which is connected between positive DC terminal 24 and the interconnection in the neutral clamping circuit of the cathode of diode 50 and the collector of transistor 52. It is preferred to make capacitor 190 connections as close as possible to the collectors of transistors 12 and 52. A second snubber circuit includes a capacitor 192 which is connected between negative DC terminal 38 and the interconnection in the neutral clamping circuit of the anode of diode 54 and the emitter of transistor 56. It is preferred to make the capacitor 192 connections as close as possible to the emitters of transistors 14 and 56. The snubber circuits of the present invention, therefore, feature a single component for each half cycle of the inverter.

To obtain the desired operation of the snubber circuits, transistors 52 and 56 are preferably enabled in accordance with the embodiment of the invention illustrated in FIGS. 2 and 3. At a minimum, however, transistor 52 is enabled at least when transistor 12 is disabled during the positive half cycle of operation and transistor 56 is enabled at least when transistor 14 is disabled during the negative cycle of operation.

The power inverter of FIG. 5 provides current to load 64 during the positive half cycle of operation from one of two sources. Load current can be supplied from positive terminal 24 through transistor 12 or through capacitor 190. Load current can also be supplied from neutral terminal 26. During the positive cycle of operation, when transistor 12 is enabled, load current is provided from positive terminal 24 through transistor 12. As mentioned before, when transistor 12 is disabled, transistor 52 either is or has been enabled. A current path, therefore, is provided from positive terminal 24 through capacitor 190 and transistor 52 to load 64. Current flows through capacitor 190 until capacitor 190 is charged to or above the potential of the positive terminal 24. Then the load current is supplied from neutral terminal 26 through transistor 52. When transistor 12 is once again enabled capacitor 190 is discharged through transistor 12 so the charging cycle can be repeated. This puts stress on transistors 12 and 52.

The operation during the negative half cycle, wherein the power inverter must sink current form the load, is similar. The load current is supplied to either negative terminal 38 or to neutral terminal 26 during the negative half cycle of operation.

Negative terminal 38 can receive current through transistor 14 or through capacitor 192. During the negative cycle of operation, when transistor 14 is enabled, load current is provided to negative terminal 38 through transistor 14. As mentioned before, when transistor 14 is disabled, transistor 56 either is or has been enabled. A current path, therefore, is provided from load 64 through transistor 56 and capacitor 192 to negative terminal 38. Current flows through capacitor 192 until capacitor 192 is charged to the potential of negative terminal 38. Then the load current is supplied to neutral terminal 26 through transistor 56. When transistor 14 is once again enabled, capacitor 192 is discharged through transistor 14 so the charging cycle can be repeated. This puts stress on transistors 14 and 56.

The above-described operation of the snubber circuits increases the rise time of the current through power transistors 12 and 14 when they are disabled. This results in increasing switching losses in each of the power transistors 12 and 14. The energy stored in capacitors 190 and 192 goes to the respective transistors 12 and 14.

The increased rise time of the voltage across power transistors 12 and 14 also reduces the effects of parasitic inductances which, for example, might result from the length of a conductor 194. These parasitic inductances induce voltages in accordance with the equation $V=L(di/dt)$ where L is the parasitic inductance. The increased voltage rise time means that the voltage takes longer to reach a predetermined value. The quantity dt, therefore, is greater so that the induced voltage, V, is reduced.

With the above-described operation of the snubber circuits in mind, it will be appreciated that during the positive half cycle of operation the negative switch snubber (capacitor 192) will also charge and discharge and during the negative half-cycle of operation the positive switch snubber (capacitor 190) will likewise charge and discharge. This results in additional power losses which will be recognized as undesirable.

Figure 6:
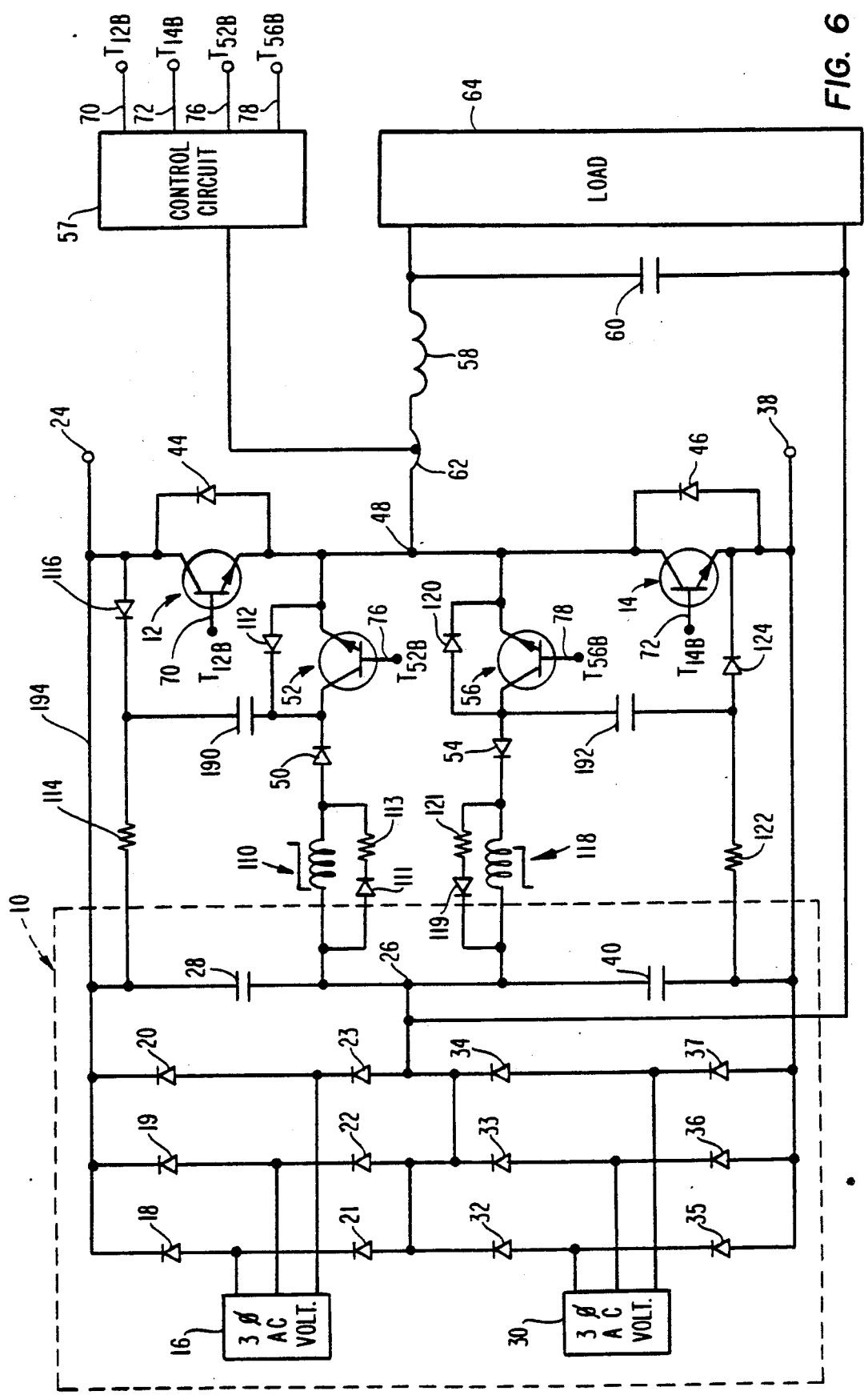
FIG. 6 is an electrical schematic diagram illustrating a neutral clamped power inverter having an active snubber circuit for reducing snubbing losses in accordance with the invention.

In order to alleviate this condition an active snubber arrangement is provided as illustrated in FIG. 6, and whereby snubber losses are minimized when either the positive or negative snubber switches are inactive.

Thus, and with reference to FIG. 6, a saturable reactor 110 includes a coil having one leg connected to neutral terminal 26 and the other leg connected to the anode of diode 50. A diode 111 and a resistor 113 are serially connected across the saturable reactor coil. A diode 112 has an anode connected to the emitter of transistor 52 and a cathode connected to the cathode of diode 50. A resistor 114 is connected through capacitor 28 to neutral terminal 26 and is serially connected to the cathode of a diode 116. The anode of diode 116 is connected between the collector of transistor 12 and positive terminal 24. Capacitor 190 is connected between resistor 114 and the cathode of diode 116, and is connected between the cathode of diode 50 and the collector of transistor 52 as also shown in FIG. 5.

Likewise, and with continued reference to FIG. 6, a saturable reactor 118 includes a coil having one leg connected to neutral terminal 26 and the other leg connected to the cathode of diode 54. A diode 119 and a resistor 121 are serially connected across the saturable reactor coil. A diode 120 has a cathode connected to the collector of transistor 56 and an anode connected between capacitor 192 and the anode of diode 54. A resistor 122 is connected through capacitor 40 to neutral terminal 26 and is connected to the anode of a diode 124. The cathode of diode 124 is connected between the emitter of transistor 14 and negative terminal 38.

Diodes 112 and 120 reduce reverse voltage stress on switches 52 and 56, respectively.

With the configuration described above, the snubber acts as a polarized active snubber for power switches 12 and 14 and a non-polar snubber for bidirectional switching so that one snubber acts common to the two power switches to reduce the circuit component count.

Thus, a bidirectional switch path is created via the arrangement including saturable reactor 110, diode 111 and resistor 113; and the arrangement including saturable reactor 118, diode 119 and resistor 121. This arrangement improves a recovery problem suffered by diodes 50 and 54, respectively.

With the arrangement described turn-off snubber losses are significantly reduced and a snubber recovery feature is provided.

It will be recognized that if the described snubber feature were arranged in the main current path, i.e. the path of switches 12 an 14, an increased power loss would be realized.

During the positive half-cycle of operation (switch 12), negative side snubber circuitry including diode 124, capacitor 192 and resistor 122 is inactive so as not to dissipate any energy. During the negative half-cycle of operation (switch 14), positive side snubber circuitry including diode 116, capacitor 190 and resistor 114 are likewise inactive so as not to dissipate any energy. The energy stored in capacitors 28 and 40 is dissipated in resistors 114 and 122, respectively, and hence will not be dissipated in power transistors 12 and 14, respectively.

Referring to FIG. 1, conventional snubber circuitry is illustrated and wherein components corresponding to those shown in FIG. 6 carry like numerical designations but with the subscript P. Thus, for the positive half-cycle (switch 12) snubber circuitry includes a resistor 122P, a diode 124P and a capacitor 192P; and a resistor 114P, a diode 116P and a capacitor 190P are included for the negative half cycle (switch 14). This arrangement will dissipate power during both positive and negative half-cycles, and hence snubber losses will be twice that of the active snubber arrangement shown in FIG. 6, which reduces these snubber losses by one-half.

With the above description of the invention in mind, reference is made to the claims appended hereto for a definition of the scope of the invention.

What is claimed is:

1. A power inverter for providing at a load an AC signal having a desired positive voltage during a positive cycle of operation and a desired negative voltage during a negative cycle of operation, comprising:

a DC power source having a positive, a negative and a neutral terminal;

first switching means connected between said positive terminal and an output terminal for positively biasing said output terminal when said first switching means is selectively enabled to obtain the desired positive voltage in the AC signal;

second switching means connected between said negative terminal and said output terminal for negatively biasing said output terminal when said second switching means is selectively enabled to obtain the desired negative voltage in the AC signal;

third switching means having a first terminal connected to said output terminal and a second terminal connected to a cathode of a first diode, said first diode having an anode connected to said neutral terminal, said third switching means providing a current path from said neutral terminal to said output terminal when enabled;

fourth switching means having a first terminal connected to said output terminal and a second terminal connected to an anode of a second diode, said second diode having a cathode connected to said neutral terminal, said fourth switching means providing a current path from said output terminal to said neutral terminal when enabled;

current sensing means connected between said output terminal and the load for sensing current direction therebetween and for providing a corresponding output;

controller means connected to said current sensing means and to said third and fourth switching means and responsive to the output from the current sensing means for selectively enabling and disabling said third and fourth switching means;

a first capacitor connected between said positive terminal and said cathode of said first diode;

a second capacitor connected between said negative terminal and said anode of said second diode;

said third switching means is enabled when said first switching means is disabled so as to provide a current path from said positive terminal through said first capacitor to said output terminal, and wherein said fourth switching means is enabled when said second switching means is disabled so as to provide a current path from said output terminal through said second capacitor to said negative terminal;

means connected to the first and second switching means, to the neutral terminal and to the first and second capacitors for minimizing power losses when one of the first and second switching means is disabled; and means connected to the first and second diodes and to the neutral terminal for enhancing the recovery characteristics of said first and second diodes.

2. A power inverter as described by claim 1, wherein the means connected to the first and second switching means, to the neutral terminal and to the first and second capacitors for minimizing power losses when one of the first and second switching means is disabled includes:

a third diode having an anode connected to a first terminal of the first switching means;

a first resistor connected to a cathode of the third diode and capacitively coupled to the neutral terminal by said first capacitor;

a fourth diode having an anode connected to a second terminal of the first switching means and a cathode connected to the cathode of the first diode;

the first capacitor connected between the cathode of the third diode and the first resistor and connected to the cathode of the first diode;

a fifth diode having a cathode connected to a first terminal of the second switching means;

a second resistor connected to the anode of the fifth diode and capacitively coupled to the neutral terminal by said second capacitor;

a sixth diode having a cathode connected to a second terminal of the second switching means and an anode connected to the anode of the second diode; and the second capacitor connected between the anode of the fourth diode and the second resistor and connected to the anode of the second diode.

3. A power inverter as described by claim 1, wherein the means connected to the first and second diodes and to the neutral terminal for enhancing the recovery characteristics of said first and second diodes includes:

a first saturable reactor connected to the anode of the first diode and connected to the neutral terminal;

a third diode having an anode connected to one leg of a coil of the first saturable reactor;

a first resistor connected to a cathode of the third diode and connected to the other leg of the saturable reactor coil;

a second saturable reactor connected to the cathode of the second diode and connected to the neutral terminal;

a fourth diode having a cathode connected to one leg of a coil of the second saturable reactor; and a second resistor connected to an anode of the fourth diode and connected to the other leg of the saturable reactor.

4. A power inverter as described by claim 1, wherein:

said third switching means is enabled at least when said first switching means is disabled so as to provide a current path from said positive terminal through said first capacitor to said output terminal; and said fourth switching means is enable at least when said second switching means is disabled so as to provide a current path from said output terminal through said second capacitor to said negative terminal.

5. A power inverter as described by claim 1, wherein:

said first capacitor is discharged through said first switching means when said first switching means is enabled; and said second capacitor is discharged through said second switching means when said second switching means is enabled.

6. A power transistor as described by claim 5, wherein:

said third and fourth switching means are transistors, said third transistor having an emitter connected to said output terminal, a collector connected to said cathode of said first diode and abase connected to said controller means; and said fourth transistor having an emitter connected to said neutral terminal, a collector connected to said cathode of said second diode and a base connected to said controller means.

7. A power inverter for providing at a load an AC signal, comprising:

a DC power source having a positive, a negative and a neutral terminal;

first switching means connected between said positive terminal and an output terminal for positively biasing said output terminal when said second switching means is enabled;

second switching means connected between siad negative terminal and said output terminal for negatively biasing said output terminal when siad second switching means is enabled;

third switching means having a first terminal connected to said output terminal and a second terminal connected to said neutral terminal for providing a current path from said neutral terminal to said output terminal when enabled;
fourth switching means having a first terminal connected to said output terminal and a second terminal connected to said neutral terminal for providing a current path from said neutral terminal to said neutral terminal when enabled;
current sensing means connected between said output terminal and the load for sensing current direction therebetween and for providing a corresponding output;
controller means connected to said current sensing means and to said third and fourth switching means and responsive to the output from the current sensing means for selectively enabling and disabling said third and fourth switching means;
a first capacitor connected between said positive terminal and said second terminal of said third switching means;
a second capacitor connected between said negative terminal and said second terminal of said fourth switching means;
said third switching means is enabled when said first switching means is disabled so as to provide a current path from said positive terminal through said first capacitor to said output terminal, and wherein said fourth switching means is enabled when said second switching means is disabled so as to provide a current path from said output terminal through said second capacitor to said negative terminal;
means connected to the first and second switching means, to the neutral terminal and to the first and second capacitors for minimizing power losses when one of the first and second switching means is disabled; and
means connected to the first and second diodes and to the neutral terminal for enhancing the recovery characteristics of said first and second diodes.

8. A power inverter as described in claim 7, wherein:
said third switching means is enabled at lest when said first switching means is disabled so as to provide a current path from said positive terminal through said first capacitor to said output terminal; and
said fourth switching means is enabled at least when said second switching means is disabled so as to provide a current path from said output terminal through said second capacitor to said negative terminal.

9. A power inverter as described by claim 7, wherein:
said first capacitor is discharged through said first switching means when said first switching means is enabled; and
said second capacitor is discharged through said second switching means when said second switching means is enabled.

10. A power inverter as described by claim 9, wherein:
said third and fourth switching means are transistors, said third transistor having an emitter connected to said output terminal, a collector connected to said cathode of said first diode and a base connected to said controller means; and
said fourth transistor having an emitter connected to said neutral terminal, a collector connected to said cathode of said second diode and a base connected to said controller means.

11. A power inverter as described by claim 7, wherein the means connected to the first and second switching means, to the neutral terminal and to the first capacitor for minimizing power losses when one of the first and second switching means is disabled includes:
a third diode having an anode connected to a first terminal of the first switching means;
a first transistor connected to a cathode of the third diode and capacitively coupled to the neutral terminal by said first capacitor.
a fourth diode having an anode connected to a second terminal of the first switching means and a cathode connected to the cathode of the first diode;
the first capacitor connected between the cathode of the third diode and the first resistor and connected to the cathode of the first diode;
a fifth diode having a cathode connected to a first terminal of the second switching means;
a second resistor connected to the anode of the fifth diode and capacitively coupled to the neutral terminal by said second capacitor;
a sixth diode having a cathode connected to a second terminal of the second switching means and an anode connected to the anode of the second diode; and
the second capacitor connected between the anode of the fourth diode and the second resistor and connected to the anode of the second side.

* * * * *